United States Patent [19]
Fujikawa

[11] Patent Number: 5,910,013
[45] Date of Patent: Jun. 8, 1999

[54] PROCESS FOR MANUFACTURING A SOLID-STATE PICK-UP DEVICE

[75] Inventor: Kazuhide Fujikawa, Kanagawa, Japan

[73] Assignee: Sony Corporation, Tokyo, Japan

[21] Appl. No.: 08/691,250

[22] Filed: Aug. 2, 1996

[30] Foreign Application Priority Data

Aug. 4, 1995 [JP] Japan .................................. 7-199491

[51] Int. Cl.$^6$ .............................................. H01L 21/00
[52] U.S. Cl. .............................................................. 438/57
[58] Field of Search .................................. 438/60, 75, 144, 438/57, 366; 313/366; 257/183.1, 215, 218, 912; 327/271

[56] References Cited

U.S. PATENT DOCUMENTS

| | | | |
|---|---|---|---|
| 4,460,912 | 7/1984 | Takeshita et al. | 257/223 |
| 4,691,218 | 9/1987 | Boudewijns | 257/241 |
| 5,324,669 | 6/1994 | Kudora et al. | 438/75 |

Primary Examiner—Charles Bowers
Assistant Examiner—Craig Thompson
Attorney, Agent, or Firm—Hill & Simpson

[57] ABSTRACT

A V-H transfer section is formed by the following steps: N+-type impurities are first ion-implanted in such a manner that they spread out into an area larger than a channel of a vertical transfer register. An electrode of the vertical transfer register and electrodes of a horizontal transfer register are then formed. Thereafter, P+-type impurities are implanted into the electrode of the vertical transfer register and the electrodes of the horizontal transfer register in a self-alignment manner.

6 Claims, 6 Drawing Sheets

PROCESS FOR MANUFACTURING A SOLID-STATE PICK-UP DEVICE

BACKGROUND OF THE INVENTION

The present invention relates to a process for manufacturing a solid-state image pick-up device. More particularly, the invention relates to a process for manufacturing a charge transfer section, used in a solid-state image pick-up device, for transferring charges from vertical transfer registers to a horizontal transfer register.

As a solid-state image pick-up device, on the whole, becomes smaller, the dimensions of the individual elements of the device accordingly decrease. As an example of the downsizing of the elements of the device, the channel width of a charge transfer section for transferring signal charges from vertical transfer registers to a horizontal transfer register (hereinafter referred to as "the V-H transfer section") is decreased.

FIG. 8 is an elevational view of a conventional V-H transfer section. FIG. 9 is a cross sectional view along line Y-Y' of FIG. 8. Referring to FIGS. 8 and 9, a vertical transfer register 81 is comprised of channels 83 and electrodes 84-1 and 84-4 (only the electrode 84-4 is shown in FIG. 8) that are driven in, for example, four phases. The channels 83 are formed by ion-implanting N+-type impurities into the upper top surface of a silicon substrate 82. The four-phase electrodes 84-1 to 84-4 are disposed above the channels 83 and are sequentially arranged in the transfer direction. On the other hand, a horizontal transfer register 85 includes a channel 86 and electrode pairs 87-1 and 87-2, driven in, for example, two phases, each pair forming a storage electrode ST and a transfer electrode TR. The channel 86 is formed by ion-implanting N+-type impurities into the obverse surface of the silicon substrate 82. On the other hand, the electrode pairs 87-1 and 87-2 are disposed above the channel 86 and are sequentially arranged in the transfer direction. In each of the electrode pairs 87-1 and 87-2, the storage electrode ST (indicated by the one-dot broken line in FIG. 8) is formed of a first polysilicon layer, while the transfer electrode TR (designated by the two-dot broken line in FIG. 8) is formed of a second polysilicon layer.

Further, the transfer electrode TR of the first phase ($\phi$H1) electrode pair 87-1 extends until the fourth-phase ($\phi$V4) electrode 84-4 along the channel 83 of the vertical transfer register 81. The extending portion TR' of the transfer electrode TR projecting from the channel 86, together with the channel 83 positioned under the portion TR', form a V-H transfer section 88 for transferring signal charges from the vertical transfer register 81 to the horizontal transfer register 85.

In the V-H transfer section 88 constructed as described above, the channel width is determined by the manufacturing precision of the channel 83 and the transfer electrode TR of the first-phase ($\phi$H1) electrode pair 87-1 of the horizontal transfer register 85. More specifically, in consideration of the matching precision of the channel 83 to the extending portion TR' of the transfer electrode TR of the first-phase ($\phi$H1) electrode pair 87-1 during manufacturing of the V-H transfer section 88, the channel 83 should be formed within the edges of the transfer electrode TR, away from each edge across a predetermined distance (margin) A so that it does not project from the extending portion TR'.

As described above, in the conventional solid-state image pick-up device, the channel width of the V-H transfer section 88 depends on the manufacturing precision of the channel 83 and the transfer electrode TR of the first-phase electrode pair 87-1 of the horizontal transfer register 85. Thus, considering manufacturing precision, the channel width of the V-H transfer section 88 cannot be increased to a great degree. Under this restriction, if the individual elements of the solid-state image pick-up device are decreased along with the downsizing of the overall device, the channel width of the V-H transfer section 88 inevitably should be made smaller. However, an excessively smaller channel width of the V-H transfer section 88 degrades the transfer efficiency of signal charges from the vertical transfer register 81 to the horizontal transfer register 85. This imposes a restriction of the downsizing of the solid-state image pick-up device.

SUMMARY OF THE INVENTION

It is an object of the present invention to provide a process for manufacturing a solid-state image pick-up device in which the transfer efficiency of a V-H transfer section can be improved, and yet, miniaturization of the device can also be achieved.

To that end, in an embodiment, the invention provides a process for manufacturing a charge transfer section, used in a solid-state image pick-up device, for transferring charges from a vertical transfer register to a horizontal transfer register, the process comprising the steps of: ion-implanting first conductive-type impurities in such a manner that they are spread out in an area larger than a channel region of the vertical transfer register; forming electrodes of the vertical transfer register and the horizontal transfer register; and ion-implanting second conductive-type impurities into the electrodes in a self-alignment manner.

In an embodiment, the invention provides a process wherein said ion-implanting step of implanting the first conductivity-type impurities is applied to a channel region of said horizontal transfer register.

In an embodiment, the invention provides a process for manufacturing a charge transfer device comprising the steps of forming a diffusion region of a first conductivity-type as a channel of a transfer section; forming an insulating layer on said diffusion region; forming a transfer electrode on said diffusion region through said insulating layer; and ion-implanting second conductivity-type impurities using said transfer electrode as a mask thereby to define an edge of said channel.

In an embodiment, the invention provides a process wherein said ion-implanting step defines both edges of said channel.

In an embodiment, the invention provides a process wherein said charge transfer device comprises a vertical transfer register and a horizontal transfer register connected to said vertical transfer register through a V-H transfer section.

In an embodiment, the invention provides a process wherein said transfer section is said V-H transfer section.

In an embodiment, the invention provides a process wherein said transfer section is said horizontal transfer register.

In an embodiment, the invention provides a process wherein said transfer section is said V-H transfer section and said horizontal transfer register.

In an embodiment, the invention provides a process for manufacturing a charge transfer comprising a vertical transfer register and a horizontal transfer register connected thereto through a V-H transfer section in a semiconductor body, said process comprising the steps of forming a first diffusion region of a first conductivity type as a first channel of said V-H transfer section; forming an insulating layer on said first diffusion region; forming a V-H transfer electrode on said first diffusion region through said insulating layer; and ion-implanting second conductivity-type impurities using said V-H transfer electrode as a mask thereby to define an edge of said first channel of said V-H transfer section.

In an embodiment, the invention provides a process wherein said ion-implanting step defines both edges of said first channel.

In an embodiment, the invention provides a process further comprising the steps of forming a second diffusion region of said first conductivity-type as a second channel of said horizontal transfer register; forming said insulating layer on said second diffusion region; forming a horizontal transfer electrode on said second diffusion region through said insulating layer; and ion-implanting said second conductivity-type impurities using said horizontal transfer electrode as a mask thereby to define an edge of said second channel of said horizontal transfer region.

These and other features of the invention are discussed in greater detail below in the following detailed description of the presently preferred embodiments with reference to the accompanying drawings.

DETAILED DESCRIPTION OF THE PRESENTLY PREFERRED EMBODIMENTS

An embodiment of the present invention will now be described in detail with reference to the drawings.

Figure 1:
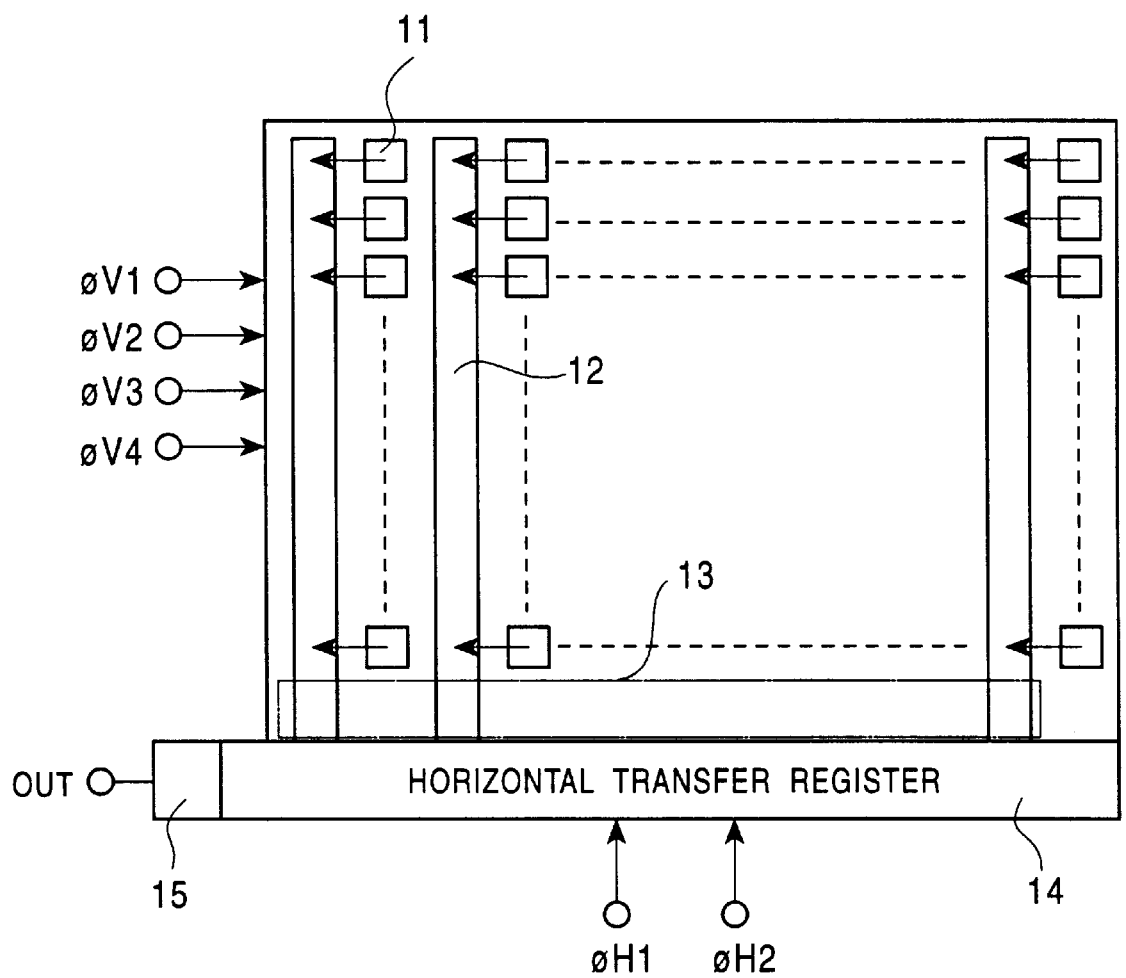
FIG. 1 is a schematic diagram of an interline transfer-type CCD solid-state image pick-up device formed by the application of the present invention.

FIG. 1 is a schematic diagram of a CCD solid-state image pick-up device of, for example, an interline transfer-type, formed by the application of the present invention. In FIG. 1, a plurality of photosensors 11 are two-dimensionally disposed, and a plurality of vertical transfer registers 12 formed of charge-coupled devices (CCDs) are provided for each group of the vertically-arranged photosensors 11. The photosensors 11 convert incident light to signal charges whose amount is determined by the light quantity, and store the charges therein. A V-H transfer section 13 is disposed at the ends of the vertical transfer registers 12 on the transfer side, and a horizontal transfer register 14 formed of CCDs is further arranged. Provided at the end of the horizontal transfer register 14 on the transfer side is a charge detection section 15 formed of, for example, a floating diffusion amplifier. The vertical transfer registers 12 are driven, for example, in four phases by four-phase transfer pulses $\phi V1$ to $\phi V4$, while the horizontal transfer register 14 is driven, for example, in two phases by two-phase transfer pulses $\phi H1$ and $\phi H2$.

In the CCD solid-state image pick-up device constructed as described above, the incident light is photoelectrically converted in the individual photosensors 11 and the resulting signal charges are stored therein. The signal charges stored in the photosensors 11 are read out to the corresponding vertical transfer registers 12 via a reading gate section (not shown). The vertical transfer register 12 transfers the signal charges read from the photosensors 11 by one stage during a certain period of one horizontal scanning period, for example, a horizontal blanking period. Accordingly, the signal charges in a plurality of vertical transfer registers 12 are transferred to the horizontal transfer register 14 line by line (scanning line) via the V-H transfer section 13. The signal charges for each line are sequentially transferred horizontally by the horizontal transfer register 14. The charges are further converted to a signal voltage in the charge detecting section 15 and are then output.

Figure 2:
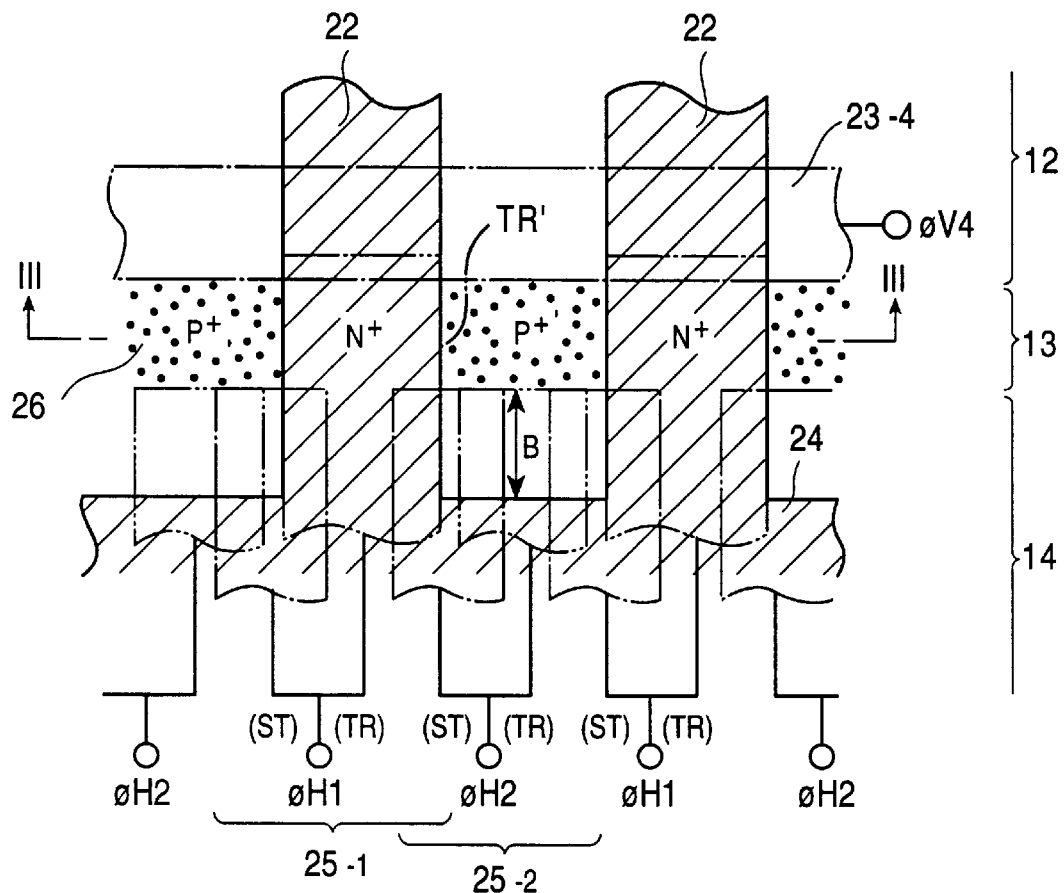
FIG. 2 is an elevation according to a first embodiment of the present invention.
Figure 3:
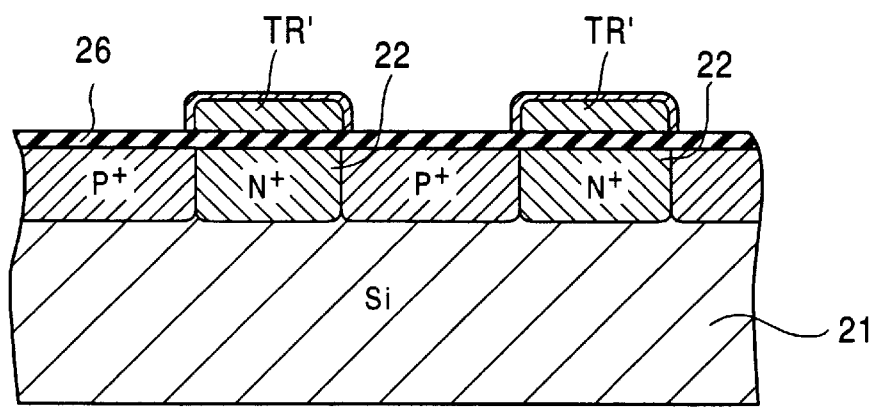
FIG. 3 is a cross sectional view along line X-X' of FIG. 2.

FIG. 2 is an elevational view of the V-H transfer section 13 and the portions adjacent to the section 13 according to the present invention. FIG. 3 is a cross sectional view along line X-X' of FIG. 2. Referring to FIGS. 2 and 3, the vertical transfer register 12 is comprised of channels 22 and four-phase ($\phi V1$ to $\phi V4$) electrodes 23-1 to 23-4 (the only fourth-phase ($\phi V4$) electrode 23-4 is shown in FIG. 2). The channels 22 have been formed by ion-implanting N+-type impurities into the obverse surface of a silicon substrate 21. The four-phase electrodes 23-1 to 23-4 are disposed above the channels 22 and are sequentially arranged in the transfer direction.

On the other hand, the horizontal transfer register 14 is formed of a channel 24 and two-phase ($\phi H1$ and $\phi H2$) electrode pairs 25-1 and 25-2, each pair forming a storage electrode ST and a transfer electrode TR. The channel 24 has been formed by ion-implanting first conductivity N+-type impurities into the upper surface of the silicon substrate 21. The electrode pairs 25-1 and 25-2 are disposed above the channel 24 and are sequentially arranged in the transfer direction. In the electrode pairs 25-1 and 25-2, the storage electrode ST indicated by the one-dot chain line in FIG. 2 is formed of a first polysilicon layer, while the transfer electrode TR designated by the two-dot chain line in FIG. 2 is formed of a second polysilicon layer. The transfer electrode TR of the first-phase ($\phi H1$) electrode pair 25-1 extends along the channel 22 of the vertical transfer register 12 until the fourth-phase ($\phi H4$) electrode 23-4. Further, the extending portion TR' of the transfer electrode TR, together with the channel 22 located under the portion TR', constitute the V-H transfer section 13 for transferring signal charges from the vertical transfer register 12 to the horizontal transfer register 14. Second conductivity P+-type impurities have been ion-implanted into a region 26 surrounded by the fourth-phase ($\phi V4$) electrode 23-4 of the vertical transfer register 12, the electrode (the extending portion of the transfer electrode TR) TR' of the V-H transfer section 13, and the electrode pairs 25-1 and 25-2 of the horizontal transfer register 14.

An explanation will now be given with reference to the flow chart of FIG. 4 of a process for manufacturing the V-H transfer section 13 and the portions adjacent to the section 13.

Figure 4:
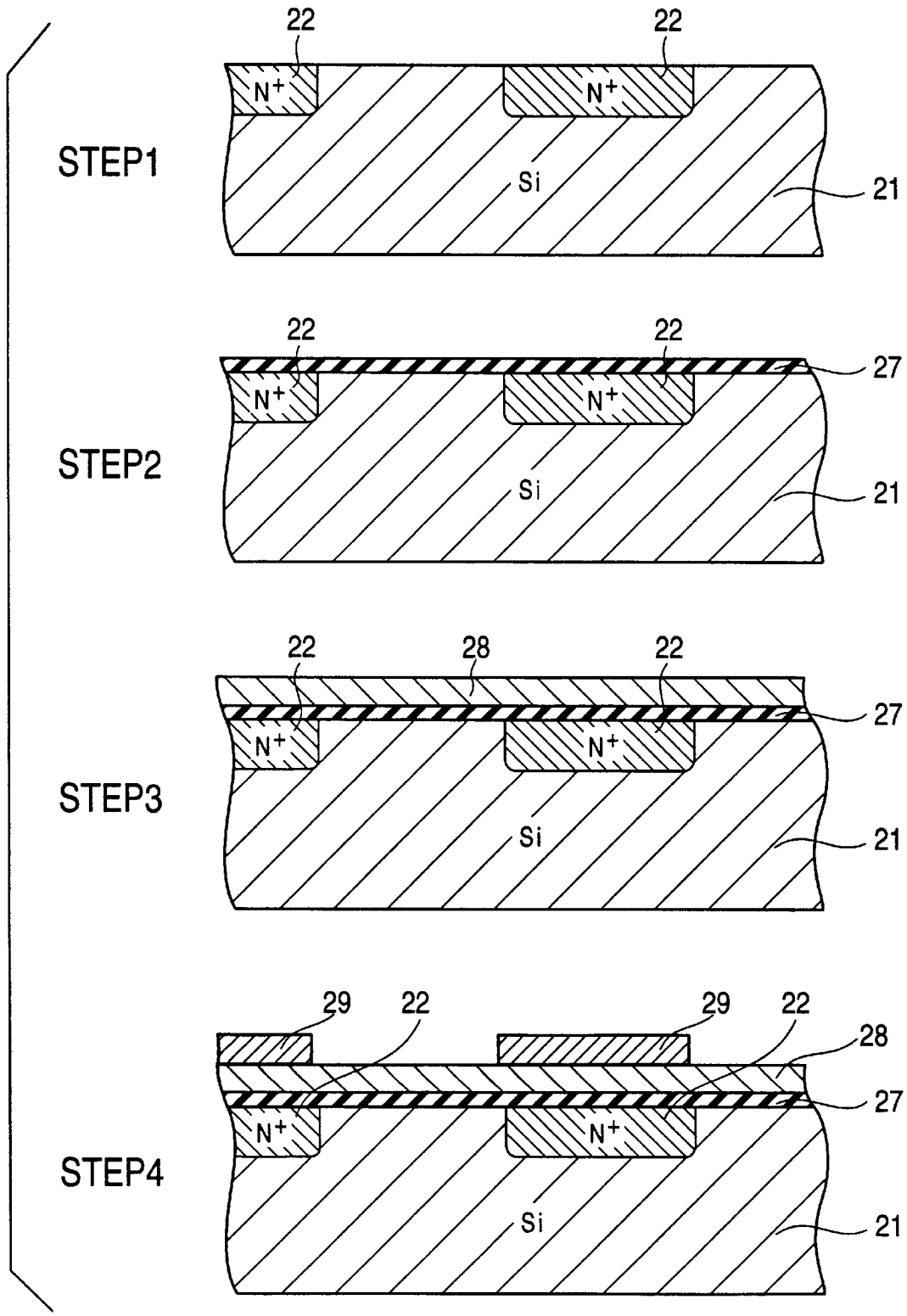
FIG. 4 illustrates a first manufacturing process according to the first embodiment.

In FIG. 4, N+-type impurities are first ion-implanted into the silicon substrate 21 so as to provisionally form channels 22 of the vertical transfer register 12 having a channel width equal to or greater than the transfer electrode TR (extending portion TR') of the horizontal transfer register 14 (step 1). Subsequently, a silicon oxide film ($SiO_2$) 27 is deposited on the surface of the substrate 21 (step 2), and a polysilicon layer 28 is then formed on the silicon oxide film 27 (step 3). Thereafter, resists 29 are patterned on the polysilicon layer 28 in the form of the electrode 24' of the V-H transfer section 13 and the transfer electrodes TR of the horizontal transfer register 14 (step 4).

Figure 5:
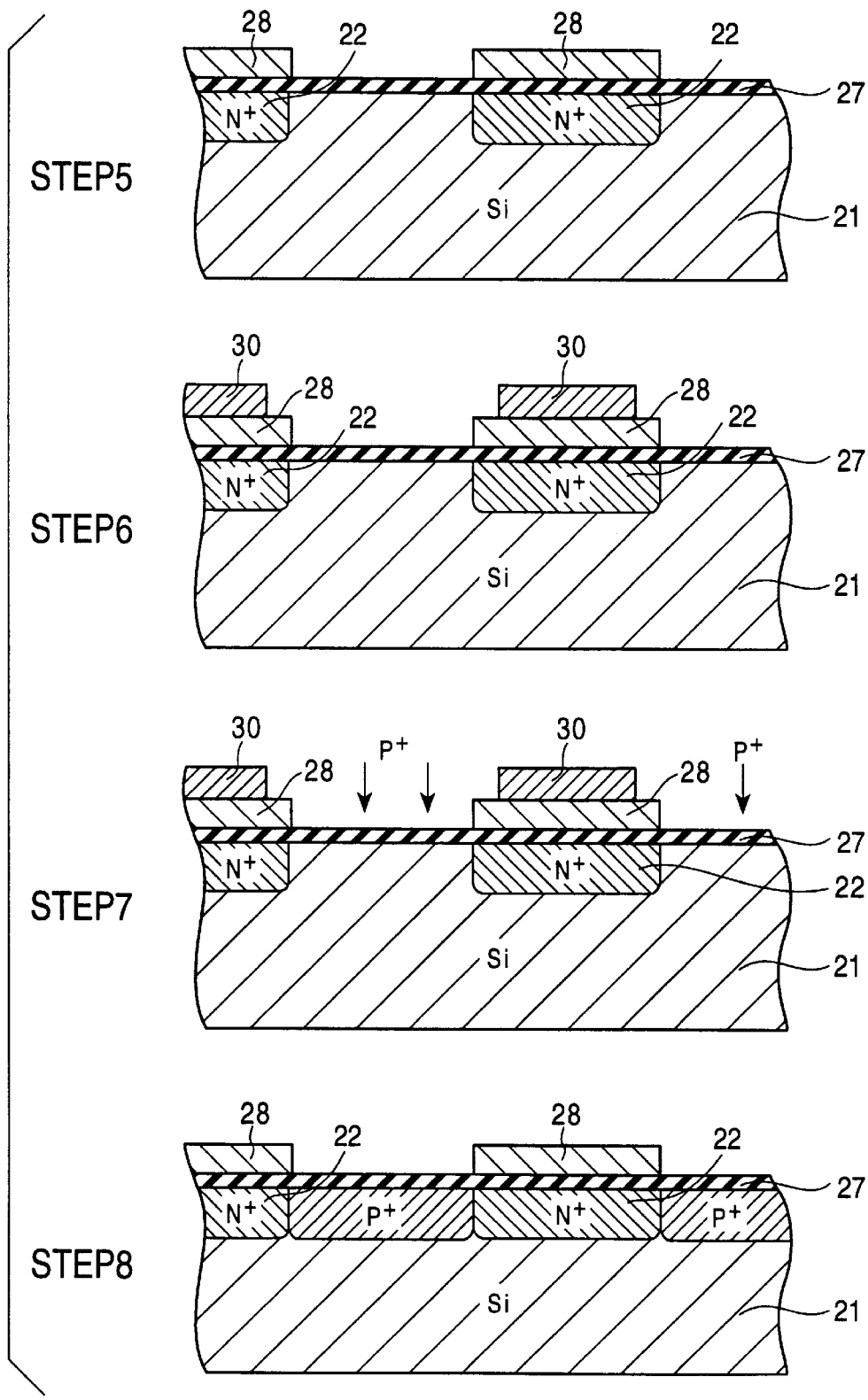
FIG. 5 illustrates a second manufacturing process according to the first embodiment.

Referring also to FIG. 5, etching is performed using the resist 29 as a mask, and the resist 29 is then released (step 5). Then, a resist 30 is applied onto the fourth-phase electrode 23-4 of the vertical transfer register 12, the electrode TR' (extending portion of the transfer electrode TR) of the V-H transfer section 13, and the electrode pairs 25-1 and 25-2 of the horizontal transfer register 14, all of which have already been formed, so that the resist 30 can be located within the edges of the individual electrodes (step 6). Subsequently, P+-type impurities are ion-implanted into the substrate 21 by use of the resist 30 and the respective electrodes as a mask (step 7), and the resist 30 is then released (step 8).

Figure 8:
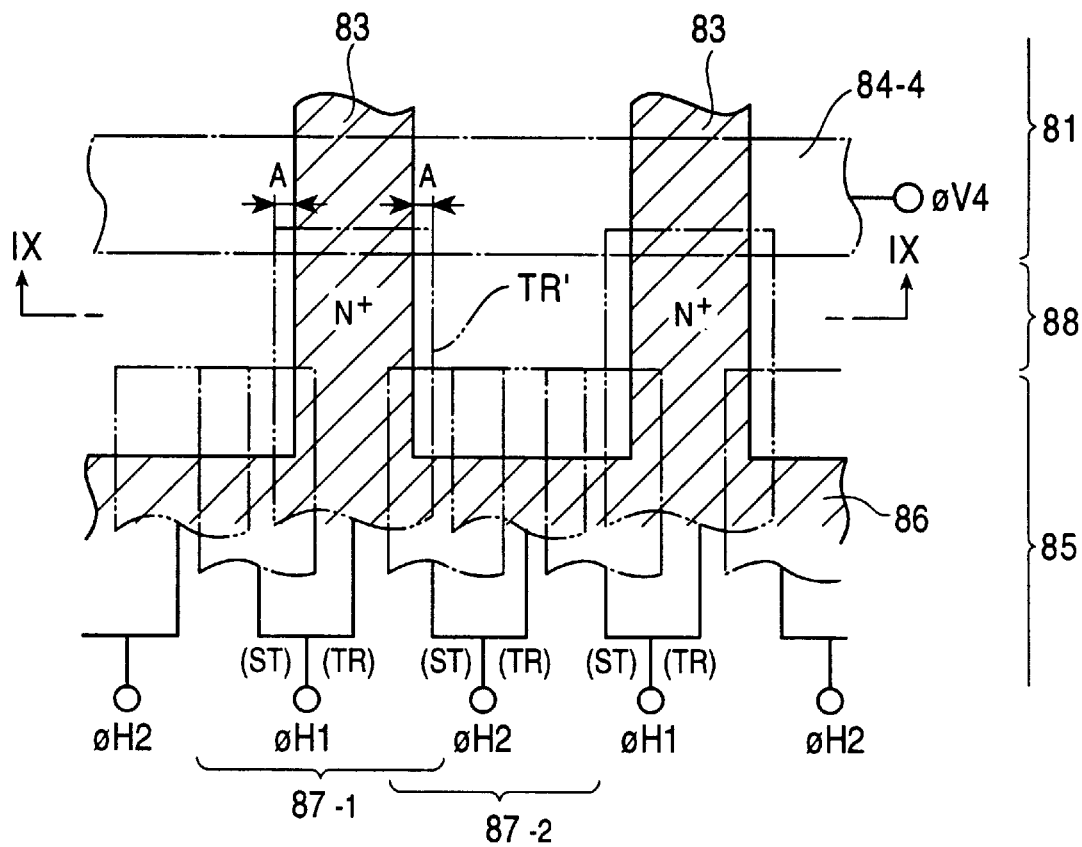
FIG. 8 is an elevation illustrating an example of conventional solid-state image pick-up devices.
Figure 9:
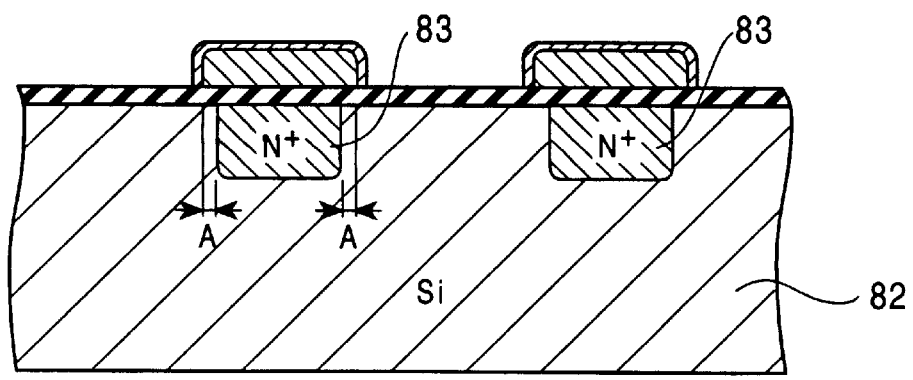
FIG. 9 is a cross sectional view along line Y-Y' of FIG. 8.

In this manner, the channel 22 of the vertical transfer register 12 is first formed wider than or equivalent to the extending portion TR' of the transfer electrode TR of the horizontal transfer register 14, and then, the fourth-phase electrode 23-4 of the vertical transfer register 12 and the electrode pairs 25-1 and 25-2 of the horizontal transfer register 14 are produced. Thereafter, ion-implantation, used for a potential barrier, is performed on the above-mentioned electrodes in a self-alignment manner, whereby the N+-type impurities forming the channel 22 projecting from the electrodes can be offset by the ion-implanted P+-type impurities. Accordingly, the resulting channel 22 is reduced to the portion having the same width as the electrode TR' (extending portion of the transfer electrode TR). As a consequence, variations in the matching precision which would be generated during manufacturing of the V-H transfer section 13 can be ignored, and the width of the channel 22 can be accordingly increased. Namely, a margin for a portion indicated by 2A (FIG. 8) is conventionally required in view of variations in the matching precision during manufacturing of the V-H transfer section. According to the manufacturing process of this embodiment, however, the margin 2A is no longer required, and the channel width can thus be increased, thereby improving the transfer efficiency of the V-H transfer section.

A second embodiment of the present invention will now be described with reference to the elevational view of FIG. 6. In the second embodiment, the manufacturing process explained in the first embodiment is applied to the channel 24 of the horizontal transfer register 14, as well as to the channel 22 of the vertical transfer register 12. The horizontal transfer register 14 of this embodiment is formed in the following manner. That is, considering the matching precision of the channel 24 to the first-phase (φH1) storage electrode ST and the second-phase (φH2) storage electrode ST and transfer electrode TR, in the horizontal transfer register 14, as well as the precision of the V-H transfer section 13, the channel 24 is formed within the edges of the electrodes across a predetermined distance (margin) B in such a manner that it does not project from the electrodes.

Figure 6:
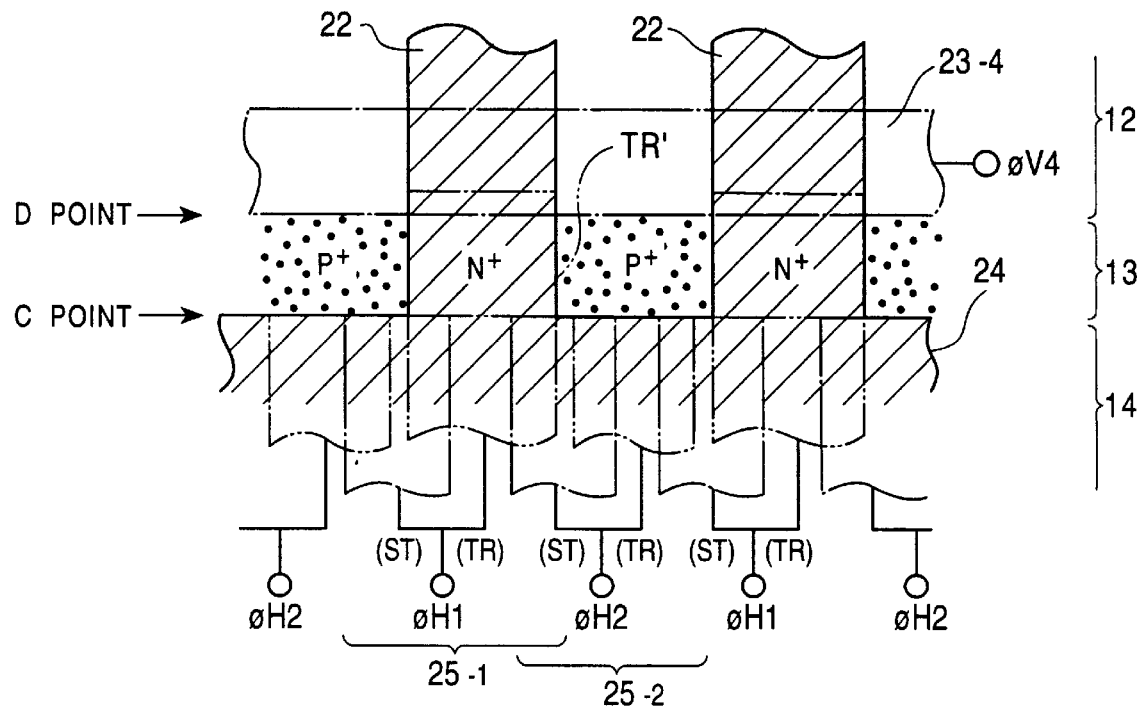
FIG. 6 is an elevation according to a second embodiment of the present invention.

With this construction, in a manufacturing process of the second embodiment similar to that of the first embodiment, the channel 24 of the horizontal transfer register 14 is extended until the point C (the edges of the first-phase (φH1) storage electrode ST and the second phase (φH2) storage electrode ST and the transfer electrode TR) shown in FIG. 6 or the point D (the edge of the fourth-phase (φV4) electrode 23-4 of the vertical transfer register 12). Subsequently, the electrode pairs 25-1 and 25-2 of the horizontal transfer register 14 and the fourth-phase electrode 23-4 of the vertical transfer register 12 are formed, and P+-type impurities used for a potential barrier, are ion-implanted into the electrodes in a self-alignment manner.

According to this process, the N+-type impurities forming the channel 14 of the horizontal transfer register 14 projecting from the electrode pairs 25-1 and 25-2, as well as the N+-type impurities forming the channel 22 of the V-H transfer section 13 projecting from the electrode TR', can be canceled by the ion-implanted P+-type impurities. Accordingly, the channel 24 of the horizontal transfer register 14, as well as the channel 22 of the V-H transfer section 13, can finally be reduced to the portion having the same width as the electrode pairs 25-1 and 25-2. This makes it possible to increase the width of the channel 22 of the V-H transfer section 13, and also to decrease the gap between the vertical transfer register 12 and the horizontal transfer register 14. The transfer efficiency of the V-H transfer section 13 can thus be enhanced to a greater degree than the first embodiment.

Figure 7:
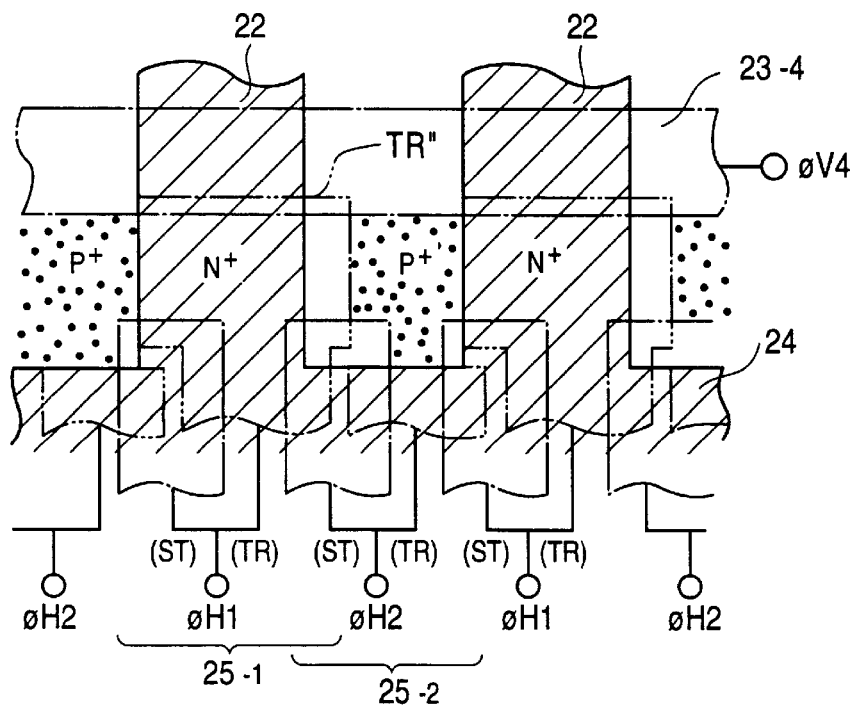
FIG. 7 is an elevation illustrating an example of the modifications of the present invention.

For improving the transfer efficiency of the V-H transfer section 13, some CCD solid-state image pick-up devices can be constructed in such a manner that the electrode TR" of the V-H transfer section 13, i.e., the extending portion TR' of the transfer electrode TR of the first-phase electrode pair 25-1 of the horizontal transfer register 14, is made wider, as shown in FIG. 7. Namely, the electrode TR" of the V-H transfer section 13 is formed wider, to provide a larger margin for variations in the matching precision which may be generated during manufacturing of the V-H transfer section 13. This can increase the channel width, whereby the transfer efficiency of the V-H transfer section 13 can be enhanced.

The first and second embodiments of the present invention are applicable to the CCD solid-state image pick-up device constructed as described above, and advantages similar to those of the first and second embodiments can be obtained. The manufacturing process is also similar to those of the first and second embodiments. More specifically, the channel 22 of the vertical transfer register is formed in such a manner that it projects from one end of the electrode TR" (the left end in FIG. 7), and the channel 24 of the horizontal transfer register 14 is formed in such a manner that it projects from one edge of each of the electrode pairs 25-1 and 25-2. Subsequently, the electrode pairs 25-1 and 25-2 (including the electrode TR" of the V-H transfer section 13) and the fourth-phase electrode 23-4 are produced, and P+-type impurities used for a potential barrier are ion-implanted into the above-mentioned electrodes in a self-alignment manner. In this case, however, the electrode TR" of the V-H transfer section 13 is elongated, and accordingly, the channel 22 is offset to one end of the electrode TR". This prevents the P+-type impurities from being ion-implanted into the portion between the channel 22 and the other end of the electrode TR". However, this portion produces no adverse influence on the transfer efficiency of the V-H transfer section 13.

As will be clearly understood from the foregoing description, the present invention offers several advantages. For manufacturing the V-H transfer section, the following process takes place. First conductivity-type impurities are ion-implanted in such a manner that they can be spread into an area slightly larger than a channel region of the vertical transfer register, and then, the electrodes of the vertical transfer register and the horizontal transfer register are formed. Subsequently, second conductivity-type impurities are implanted into these electrodes in a self-alignment manner. This eliminates the need for considering the matching precision between the channels and the electrodes and also makes it possible to extend the channel width to the widths of the electrodes. As a consequence, the transfer efficiency of the V-H transfer section can be enhanced, and yet, the solid-state image pick-up device can be downsized.

Although modifications and changes may be suggested by those skilled in the art, it is the intention of the inventors to embody within the patent warranted hereon all changes and modifications as reasonably and properly come within the scope of their contribution to the art.

I claim:

1. A process for manufacturing a charge transfer section, used in a solid-state image pick-up device, for transferring charges from a vertical transfer register to a horizontal transfer register, said process comprising the steps of:

ion-implanting first conductive-type impurities to provisionally form channel regions of a transfer register in such a manner that they are spread in an area having a width equal to or larger than a transfer register of a horizontal transfer register;

providing an insulating layer over said device;

forming electrodes of said vertical transfer register and said horizontal transfer register over said insulating layer;

forming a resist pattern on said electrodes, said resist pattern not extending beyond said electrodes; and ion-implanting second conductive-type impurities into said substrate between said electrodes in a self-alignment manner using said electrodes and said resist thereon as a mask.

2. A process according to claim 1, wherein said ion-implanting step of implanting the impurities of the first conductivity-type impurities is applied to a channel region of said horizontal transfer register.

3. The process according to claim 1, wherein said ion-implanting step of implanting the first conductivity-type impurities is applied to a channel region of said vertical transfer region.

4. A process for manufacturing a charge transfer comprising a vertical transfer and a horizontal transfer register connected thereto through a V-H transfer section in a semiconductor body, said process comprising the steps of:

forming in a substrate a first diffusion region of a first conductivity type as a first channel of said V-H transfer section;

forming an insulating layer on said first diffusion region;

forming V-H transfer electrodes over said first diffusion region on said insulating layer whose edges fall within said first diffusion region; and ion-implanting impurities of a second conductivity-type using said V-H transfer electrodes as a mask thereby to define an edge of said first channel of said V-H transfer section.

5. The process according to claim 4, wherein said ion-implanting step defines both edges of said first channel.

6. The process according to claim 4 further comprising the steps of:

forming a second diffusion region of said first conductivity-type as a second channel of said horizontal transfer register;

forming said insulating layer on said second diffusion region;

forming a horizontal transfer electrode over said second diffusion region on said insulating layer; and ion-implanting impurities of said second conductivity-type using said horizontal transfer electrode as a mask thereby to define an edge of said second channel of said horizontal transfer region.

* * * * *